(12) United States Patent
Kim et al.

(10) Patent No.: US 10,344,385 B2
(45) Date of Patent: Jul. 9, 2019

(54) METHOD FOR FORMING CONDUCTIVE PATTERN BY DIRECT RADIATION OF ELECTROMAGNETIC WAVE, AND RESIN STRUCTURE HAVING CONDUCTIVE PATTERN THEREON

(71) Applicant: LG CHEM, LTD., Seoul (KR)

(72) Inventors: Jae Hyun Kim, Daejeon (KR); Shin Hee Jun, Daejeon (KR); Jae Jin Kim, Daejeon (KR); Chee-Sung Park, Daejeon (KR); Eun Kyu Seong, Daejeon (KR); Su Jeong Lee, Daejeon (KR); Cheol-Hee Park, Daejeon (KR); Han Nah Jeong, Daejeon (KR); Sang Yun Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/910,966

(22) PCT Filed: Aug. 7, 2014

(86) PCT No.: PCT/KR2014/007325
§ 371 (c)(1),
(2) Date: Feb. 8, 2016

(87) PCT Pub. No.: WO2015/020455
PCT Pub. Date: Feb. 12, 2015

(65) Prior Publication Data
US 2016/0194759 A1 Jul. 7, 2016

(30) Foreign Application Priority Data

Aug. 9, 2013 (KR) .................. 10-2013-0094867
Jul. 1, 2014 (KR) .................. 10-2014-0081917

(51) Int. Cl.
*C23C 18/22* (2006.01)
*C23C 18/30* (2006.01)
(Continued)

(52) U.S. Cl.
CPC ............ *C23C 18/31* (2013.01); *C09D 5/24* (2013.01); *C23C 18/1608* (2013.01);
(Continued)

(58) Field of Classification Search
CPC ............ C23C 18/1608; C23C 18/1641; C23C 18/1689; C23C 18/204; C23C 18/2083;
(Continued)

(56) References Cited

U.S. PATENT DOCUMENTS 4,426,442 A    1/1984   Molenaar et al.
4,666,735 A *   5/1987   Hoover ................ H01L 21/702
                                                               257/E21.533
(Continued)

FOREIGN PATENT DOCUMENTS

CN        1323049 A    11/2001
CN     101375649 A    2/2009
(Continued)

OTHER PUBLICATIONS

Extended Search Report and the Written Opinion of the European Patent Office in Appl'n No. 14834338.7, dated Jan. 9, 2017.
(Continued)

*Primary Examiner* — William P Fletcher, III
*Assistant Examiner* — Nga Leung V Law
(74) *Attorney, Agent, or Firm* — Dentons US LLP

(57) ABSTRACT

Provided are a method for forming conductive pattern by direct radiation of an electromagnetic wave capable of forming fine conductive patterns on various kinds of polymer resin products or resin layers by a simplified process, and appropriately implementing the polymer resin products
(Continued)

having white color or various colors, and the like, even without containing specific inorganic additives in the polymer resin itself, and a resin structure having the conductive pattern formed therefrom.

The method for forming the conductive pattern by direct radiation of the electromagnetic wave includes: forming a first region having a predetermined surface roughness by selectively radiating the electromagnetic wave on a polymer resin substrate containing titanium dioxide ($TiO_2$); forming a conductive seed on the polymer resin substrate; forming a metal layer by plating the polymer resin substrate having the conductive seed formed thereon; and removing the conductive seed and the metal layer from a second region of the polymer resin substrate, wherein the second region has surface roughness smaller than that of the first region.

6 Claims, 4 Drawing Sheets

(51) Int. Cl.
| | |
|---|---|
| *C23C 18/31* | (2006.01) |
| *C23C 18/16* | (2006.01) |
| *C23C 18/32* | (2006.01) |
| *C23C 18/38* | (2006.01) |
| *C09D 5/24* | (2006.01) |
| *C25D 5/02* | (2006.01) |
| *C25D 5/56* | (2006.01) |
| *C23C 18/20* | (2006.01) |
| *H05K 1/02* | (2006.01) |
| *H05K 1/09* | (2006.01) |
| *H05K 3/02* | (2006.01) |
| *H05K 3/18* | (2006.01) |

(52) U.S. Cl.
CPC ...... *C23C 18/1612* (2013.01); *C23C 18/1641* (2013.01); *C23C 18/1689* (2013.01); *C23C 18/204* (2013.01); *C23C 18/2053* (2013.01); *C23C 18/22* (2013.01); *C23C 18/30* (2013.01); *C23C 18/32* (2013.01); *C23C 18/38* (2013.01); *C25D 5/02* (2013.01); *C25D 5/56* (2013.01); *H05K 1/0296* (2013.01); *H05K 1/09* (2013.01); *H05K 3/02* (2013.01); *H05K 3/181* (2013.01); *H05K 2201/09009* (2013.01)

(58) Field of Classification Search
CPC ..... C23C 18/1612; C23C 18/22; C23C 18/30; C23C 18/31; C23C 18/32; C23C 18/38
See application file for complete search history.

(56) References Cited

U.S. PATENT DOCUMENTS

| | | | |
|---|---|---|---|
| 5,112,434 A | 5/1992 | Goldberg | |
| 9,668,342 B2 | 5/2017 | Jun et al. | |
| 2002/0102745 A1 | 8/2002 | Lahiri et al. | |
| 2005/0064711 A1* | 3/2005 | Kliesch | C08J 7/065 438/689 |
| 2006/0008627 A1 | 1/2006 | Nyholm et al. | |
| 2006/0083939 A1 | 4/2006 | Dunbar et al. | |
| 2006/0213881 A1 | 9/2006 | Oliphant et al. | |
| 2008/0182112 A1* | 7/2008 | Kaneshiro | B32B 15/08 428/458 |
| 2008/0283275 A1 | 11/2008 | Banach et al. | |
| 2009/0000951 A1 | 1/2009 | Yumoto | |
| 2009/0202938 A1 | 8/2009 | Savariar-Hauck et al. | |
| 2009/0269606 A1 | 10/2009 | Matsumoto | |
| 2011/0076452 A1 | 3/2011 | Sakagami et al. | |
| 2012/0015288 A1 | 1/2012 | Ikeda et al. | |
| 2012/0107522 A1 | 5/2012 | Yumoto | |
| 2013/0309512 A1 | 11/2013 | Fujimura et al. | |
| 2016/0194759 A1 | 7/2016 | Kim et al. | |
| 2016/0212860 A1 | 7/2016 | Kim et al. | |
| 2017/0275764 A1 | 9/2017 | Kim et al. | |

FOREIGN PATENT DOCUMENTS

| | | | |
|---|---|---|---|
| CN | 102409319 | 4/2012 | |
| CN | 103053227 A | 4/2013 | |
| EP | 2420593 A1 | 7/2011 | |
| EP | 2555601 A1 * | 2/2013 | .......... H05K 1/0284 |
| JP | S58-106537 A | 6/1983 | |
| JP | H0480374 | 3/1992 | |
| JP | 7-116870 A | 5/1995 | |
| JP | 9-186432 A | 7/1997 | |
| JP | 2001307580 A | 11/2001 | |
| JP | 2003-243807 A | 8/2003 | |
| JP | 2004273707 A | 9/2004 | |
| JP | 2005-240151 A | 9/2005 | |
| JP | 2006124701 A | 5/2006 | |
| JP | 2007131875 A | 5/2007 | |
| JP | 2007180089 A | 7/2007 | |
| JP | 2007-525835 A | 9/2007 | |
| JP | 2008106345 A | 5/2008 | |
| JP | 2012112028 A | 6/2012 | |
| JP | 2012136769 A | 7/2012 | |
| JP | 2012523501 A | 10/2012 | |
| JP | 2012-248770 A | 12/2012 | |
| JP | 2014-58604 A | 4/2014 | |
| KR | 10-2001-0098676 A | 11/2001 | |
| KR | 10-2005-0003723 A | 1/2005 | |
| KR | 10-2006-0121475 A | 11/2006 | |
| KR | 10-2008-0016139 A | 2/2008 | |
| KR | 10-2009-0060209 A | 6/2009 | |
| KR | 10-0991105 B1 | 11/2010 | |
| KR | 10-2010-0134356 A | 12/2010 | |
| KR | 10-1049219 B1 | 7/2011 | |
| KR | 10-2011-0099889 A | 9/2011 | |
| KR | 10-2012-0107515 A | 10/2012 | |
| KR | 10-2012-0124167 A | 11/2012 | |
| KR | 10-2012-0125108 A | 11/2012 | |
| KR | 10-2013-0018819 A | 2/2013 | |
| KR | 10-2013-0023519 A | 3/2013 | |
| KR | 10-1250932 B1 | 4/2013 | |
| KR | 10-2013-0054847 A | 5/2013 | |
| KR | 10-1339640 B1 | 12/2013 | |
| TW | 494420 B | 7/2002 | |
| TW | 573059 B | 1/2004 | |
| TW | 201234462 A1 | 8/2012 | |
| WO | 02/23962 A2 | 3/2002 | |
| WO | 2011103755 A1 | 9/2011 | |
| WO | WO 2012060115 A1 * | 5/2012 | .......... H05K 1/0284 |
| WO | 2012090980 A1 | 7/2012 | |
| WO | WO-2012112483 A1 * | 8/2012 | .......... B01D 69/105 |
| WO | 2012157135 A1 | 11/2012 | |

OTHER PUBLICATIONS

Extended Search Report and the Written Opinion of the European Patent Office in Appl'n No. 14833847.8, dated Jan. 9, 2017.
Extended Search Report and the Written Opinion of the European Patent Office in Appl'n No. 14834164.7, dated Jan. 10, 2017.
Office Action of the U.S. Patent Office in U.S. Appl. No. 14/910,915, dated Dec. 16, 2016.
Hackh's Chemical Dictionary, 3rd edition, excerpts pp. 168, 660-661, and 789 (1944).
Hawley's Condensed Dictionary, 12th edition, excerpts pp. 12-13, 218-219, 680, and 918-919 (1993).
Office Action of European Patent Office in Appl'n No. 14834338.7 dated Nov. 27, 2018.
Zhang et al., "Selective metallization of polymers using laser induced surface activation (Lisa)—characterization and optimiza-

(56) References Cited

OTHER PUBLICATIONS tion of porous surface topography," International Journal of Advanced Manufacturing Technology 55: 573-580 (2011).

* cited by examiner

[FIG. 1]
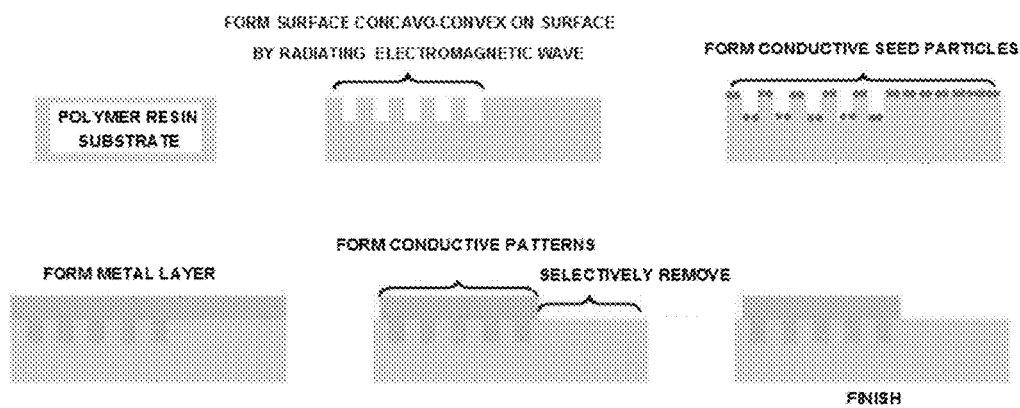
[FIG. 2a]
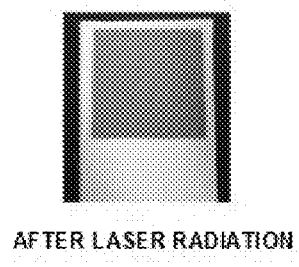
AFTER LASER RADIATION
[FIG. 2b]
SURFACE OF LASER PATTERN BEFORE PLATING (FIRST REGION)

[FIG. 3a]
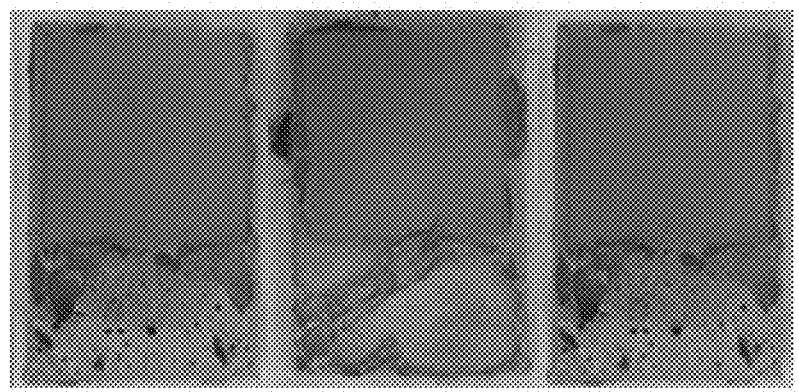
[FIG. 3b]
[FIG. 4a]
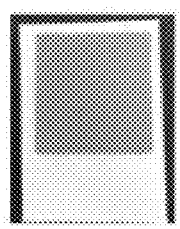
[FIG. 4b]
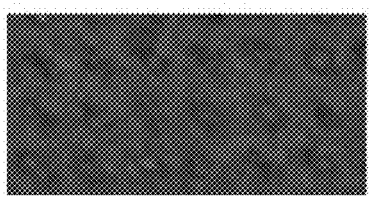

[FIG. 5]
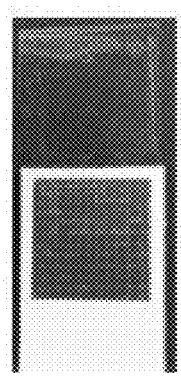
[FIG. 6]
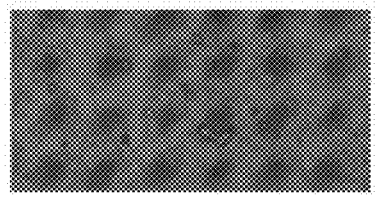

[FIG. 7]
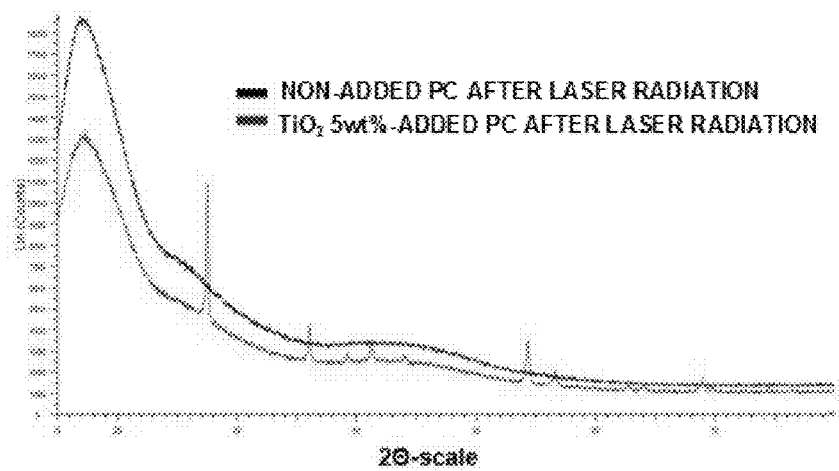

METHOD FOR FORMING CONDUCTIVE
PATTERN BY DIRECT RADIATION OF
ELECTROMAGNETIC WAVE, AND RESIN
STRUCTURE HAVING CONDUCTIVE
PATTERN THEREON

This application is a National Phase Entry of PCT/KR2014/007325 filed on Aug. 7, 2014 and claims priority to Korean Application Nos. 10-2013-0094867 filed Aug. 9, 2013 and 10-2014-0081917 filed Jul. 1, 2014 in the Korean Intellectual Property Office, all of which are incorporated by reference for all purposes as if fully set forth herein.

TECHNICAL FIELD

The present invention relates to a method for forming conductive pattern by direct radiation of an electromagnetic wave capable of forming fine conductive patterns on various kinds of polymer resin products or resin layers by a simplified process, and appropriately implementing the polymer resin products having white color or various colors, and the like, even without containing specific inorganic additives in the polymer resin itself, and a resin structure having the conductive pattern formed thereon.

BACKGROUND ART

In recent years, as a fine electronic technology is developed, demand for a structure in which fine conductive patterns are formed on a surface of polymer resin substrates (or products) of various kinds of resin products or resin layers, and the like has been increased. The conductive patterns on the surface of the polymer resin substrate and the structure may be applied to form various targets such as antennas integrated into a cellular phone case, various kinds of sensors, MEMS structures, RFID tags, and the like.

In particular, recent portable devices such as a smart phone, and the like, need to have simultaneously mounted local area network functions such as communication, bluetooth, Wi-Fi, electronic payment, and the like, unlike the existing cellular phone, and the like, and due to this reason, it is required to simultaneously mount various antennas in one smart phone. However, since aesthetic design aspect of the portable devices such as the smart phone, and the like, in addition thereto, is emphasized, a method of forming conductive patterns capable of serving as various antennas on the surface of the polymer resin substrate such as the case of the portable devices, and the like, has been continuously suggested and researched so as to simultaneously meet these demands.

As the interest in the technology of forming conductive patterns on the surface of the polymer resin substrate has been increased, several technologies regarding this were suggested. For example, a method of forming conductive patterns on a polymer resin substrate by blending and molding specific inorganic additives containing transition metals such as copper, and the like, (for example, $CuCr_2O_4$ having a spinel structure, and the like) in a polymer resin chip to form a polymer resin substrate, directly radiating an electromagnetic wave such as laser, or the like, on a predetermined region, and plating the laser radiated region to form a metal layer was suggested. In this method, the inorganic additive-derived components in the laser radiated region are exposed and function as a seed for a kind of plating, such that the metal layer and conductive patterns may be formed. However, since a substantial amount of high priced and specific inorganic additives should be used in the method for forming the conductive pattern, there is a disadvantage in that the total manufacturing cost is increased. In addition, since the inorganic additive needs to be blended into the polymer resin chip itself, the inorganic additive may deteriorate physical properties such as mechanical properties, dielectric constant, and the like, of the polymer resin substrate or resin products formed therefrom, or may cause dielectric loss.

Further, the specific inorganic additives such as $CuCr_2O_4$ having the spinel structure, and the like, have own unique colors, such that there is a limitation in implementing the polymer resin products, and the like, having colors desirable to consumers, for example, white color or other various colors. In particular, since most of the above-described inorganic additive has a dark color, when implementing the white or lighter colored products, and the like, by using the inorganic additive, color of the inorganic additive needs to be concealed by various pigments and the like, and even in the case of using $Cu_2(OH)PO_4$, $Sb/SnO_2$, and the like, showing relatively light color in the inorganic additives, the same problems as mentioned above may occur even though there is a small difference.

Due to the disadvantages, a technology capable of forming fine conductive patterns by a simplified process on various kinds of the polymer resin products or the resin layers without containing the specific inorganic additives in the polymer resin itself has been demanded. However, in the case of simply omitting the adding of the specific inorganic additives, since the electromagnetic wave needs to be radiated by relatively strong power, the manufacturing cost may be rather increased, physical properties of the polymer resin product itself may be deteriorated, and there is a technical difficulty in that it is difficult to satisfactorily form fine conductive patterns.

SUMMARY OF INVENTION

Technical Problem

The present invention has been made in an effort to provide a method for forming conductive pattern by direct radiation of an electromagnetic wave capable of forming fine conductive patterns on various kinds of polymer resin products or resin layers by a simplified process, and appropriately implementing the polymer resin products having white color or various colors, and the like, even without containing specific inorganic additives in the polymer resin itself.

In addition, the present invention has been made in an effort to provide a resin structure having the conductive pattern obtained by the method for forming the conductive pattern.

Solution to Problem

An exemplary embodiment of the present invention provides a method for forming conductive pattern by direct radiation of an electromagnetic wave, the method including: forming a first region having a predetermined surface roughness by selectively radiating the electromagnetic wave on a polymer resin substrate containing titanium dioxide ($TiO_2$); forming a conductive seed on the polymer resin substrate; forming a metal layer by plating the polymer resin substrate having the conductive seed formed thereon; and removing the conductive seed and the metal layer from a second region of the polymer resin substrate, wherein the second region has surface roughness smaller than that of the first region.

The first region of the polymer resin substrate may have surface roughness defined by a center line arithmetic average roughness of the absolute values (Ra) of about 500 nm or more, and the second region may have a center line arithmetic average roughness of the absolute values (Ra) smaller than that of the first region.

Another exemplary embodiment of the present invention provides a method a resin structure having conductive pattern including: a polymer resin substrate divided into a first region formed to have surface roughness defined by a center line arithmetic average roughness of the absolute values (Ra) of about 500 nm or more and a second region having surface roughness smaller than that of the first region, and containing titanium dioxide ($TiO_2$); and a conductive seed and a metal layer selectively formed on the first region of the polymer resin substrate.

Advantageous Effects of Invention

According to the present invention, even though high priced and specific inorganic additives such as $CuCr_2O_4$ having a spinel structure, and the like, are not contained in a polymer resin substrate itself, surface roughness and adhesion to a metal layer, of a region in which conductive patterns are formed by radiating an electromagnetic wave such as laser, or the like, may be adjusted, such that the conductive patterns may be formed on the polymer resin substrate by a simplified process.

In particular, since the process is performed in a state in which titanium dioxide capable of stabilizing heat transfer to a specific direction by the electromagnetic wave such as the laser, or the like, is added, fine conductive patterns may be satisfactorily formed on the polymer resin substrate even under radiation condition of a relatively low power electromagnetic wave, as compared to the case of not using separate additives.

Therefore, the manufacturing cost of the process of forming the conductive patterns may be decreased, and deterioration of physical properties such as mechanical properties, dielectric constant, and the like, of the polymer resin substrate or products caused by the specific inorganic additive, a high power electromagnetic wave radiation, or the like, may be reduced. Further, the titanium dioxide is component widely known as a white pigment in the related art, and the specific inorganic additive is not required to be used as described above, and therefore, according to the present invention, it is significantly easy to obtain polymer resin products having colors desirable to consumers, such as white color or other various colors.

Therefore, by using the method for forming the conductive pattern, conductive patterns for antenna, RFID tags, various kinds of sensors, MEMS structures, and the like, may be significantly effectively formed on various kinds of resin products such as a smart phone case, and the like.

BRIEF DESCRIPTION OF DRAWINGS

FIG. 1 is a diagram schematically showing one example of a method for forming conductive pattern by direct radiation of an electromagnetic wave according to an exemplary embodiment of the present invention in a process-sequence.

FIG. 2a is a photograph showing a state in which a predetermined region has surface roughness by radiating laser on a polymer resin substrate in the method for forming the conductive pattern of Example 1, and FIG. 2b is an optical microscope photograph of a laser radiated region having the surface roughness.

FIGS. 3a and 3b are photographs showing a state in which a metal layer is formed by a plating process in the method for forming the conductive pattern of Example 1.

FIG. 4a is a photograph showing a state in which the conductive patterns are formed on the polymer resin substrate by selectively removing the metal layer, and the like, from a region not radiated by laser in the method for forming the conductive pattern of Example 1, and FIG. 4b is an optical microscope photograph of the metal layer formed on the laser radiated region.

FIG. 5 is a photograph showing results obtained by forming the conductive patterns according to Example 1 and performing a cross-cut test.

FIG. 6 is an optical microscope photograph of a metal layer formed in a laser radiated region according to Comparative Example 1.

FIG. 7 is a view showing results obtained by analyzing XRD patterns of polymer resin substrates after laser radiation according to Example 1 and Comparative Example 2.

DESCRIPTION OF EMBODIMENTS

Hereinafter, a method for forming conductive pattern by direct radiation of an electromagnetic wave according to a specific exemplary embodiment of the present invention, and a resin structure having the conductive pattern formed therefrom will be described.

According to an exemplary embodiment of the present invention, the method for forming conductive pattern by direct radiation of an electromagnetic wave includes: forming a first region having a predetermined surface roughness by selectively radiating the electromagnetic wave on a polymer resin substrate containing titanium dioxide ($TiO_2$); forming a conductive seed on the polymer resin substrate; forming a metal layer by plating the polymer resin substrate having the conductive seed formed thereon; and removing the conductive seed and the metal layer from a second region of the polymer resin substrate, wherein the second region has surface roughness smaller than that of the first region.

According to the exemplary embodiment of the present invention, first, a surface structure having a shape such as concavo-convex, patterns, amorphous shape, or the like, is formed so that a polymer resin substrate of the first region has a predetermined surface roughness by radiating an electromagnetic wave such as laser, or the like, on a first region in which the conductive patterns are formed. In the first region, adhesion between a surface of the polymer resin substrate and a metal layer to be formed by plating in the first region may be improved due to the predetermined surface roughness.

Meanwhile, in a second region which is not radiated by the electromagnetic wave such as laser, or the like, poor adhesion between the surface of the polymer resin substrate and the metal layer in the second region may be shown due to original surface property of the polymer resin substrate itself.

Here, in the above-mentioned method according to an exemplary embodiment, the process of radiating the electromagnetic wave is performed in a state in which titanium dioxide is added to the polymer resin substrate. The titanium dioxide may more effectively heat transfer to a direction in which the electromagnetic wave such as laser, or the like, is radiated, that is, a depth direction of the polymer resin substrate, and more improve degree of stability of the radiation of the electromagnetic wave. As a result, aspect ratio of a hole, mesh pattern, or the like, to be formed on the region in which the electromagnetic wave is radiated may be more increased, and desired surface roughness of the first region by radiating the electromagnetic wave may be easily obtained. Therefore, as compared to the case of not using separate additives, desired level of surface roughness may be formed on the first region, and adhesion between the surface of the polymer resin substrate and the metal layer may be improved to a desired level even under the radiation condition of a relatively low power electromagnetic wave.

Accordingly, when a conductive seed for facilitating a plating process is formed on the polymer resin substrate of the first region and the plating process is performed, the metal layer having excellent adhesion with the polymer resin substrate may be favorably formed on the first region; meanwhile, the metal layer which is easily removed due to poor adhesion may be formed on the second region. Therefore, when weak physical power is applied to the polymer resin substrate to selectively remove the metal layer and the conductive seed of the second region, desired conductive patterns may be easily formed on the polymer resin substrate.

As described above, according to an exemplary embodiment of the present invention, for example, even though high priced specific inorganic additives such as $CuCr_2O_4$, and the like, having the spinel structure are not contained in the polymer resin substrate itself, surface roughness, adhesion, and the like, of the region in which the conductive patterns are formed by radiating the electromagnetic wave such as laser, or the like, may be adjusted, such that the conductive patterns may be formed on the polymer resin substrate by a simplified process. In addition, by using the titanium dioxide as described above, fine conductive patterns may be satisfactorily formed on the polymer resin substrate even under the radiation condition of a relatively low power electromagnetic wave.

Therefore, the manufacturing cost of the process of forming the conductive patterns may be decreased, and deterioration of physical properties such as mechanical properties, dielectric constant, and the like, of the polymer resin substrate or products caused by the specific inorganic additive, may be minimized.

In addition, the titanium dioxide is component widely known as a white pigment in the related art, and whiteness and brightness of the polymer resin substrate may be more improved by the addition of titanium dioxide. Further, since the specific inorganic additive showing unique color is not required to be used, according to an exemplary embodiment of the present invention, it is significantly easy to obtain the polymer resin product, and the like, having colors desirable to consumers, for example, white color or other various colors, without concealing the unique color of the specific inorganic additive by a large amount of pigment, and the like.

Meanwhile, hereinafter, the method for forming the conductive pattern by direct radiation of an electromagnetic wave according to an exemplary embodiment of the present invention is more specifically described for each process step with reference to drawings. FIG. 1 is a diagram schematically showing one example of a method for forming conductive pattern by direct radiation of an electromagnetic wave according to an exemplary embodiment of the present invention in a process-sequence.

As shown in FIG. 1, in the method for forming the conductive pattern according to an exemplary embodiment, the first region having a predetermined surface roughness is firstly formed by selectively radiating an electromagnetic wave on the polymer resin substrate.

Here, the polymer resin substrate may include without specific limitation any thermosetting resin or any thermoplastic resin capable of forming various polymer resin products or resin layers. Specific examples of the polymer resin capable of forming the polymer resin substrate may include a polyalkylene terephthalate resin such as an ABS resin, a polybutylene terephthalate resin, a polyethylene terephthalate resin, or the like, a polycarbonate resin, a polypropylene resin, a polyphthalamide resin, and the like, and in addition thereto, the polymer resin substrate may be formed by using various polymer resins.

In addition, the polymer resin substrate may contain titanium dioxide to form the first region having a predetermined surface roughness even under the radiation condition of a relatively low power electromagnetic wave, according to the technical principle as previously described. Examples of the titanium dioxide may include without specific limitation all titanium dioxides having any kind, any shape, or any crystal structure used as the white pigment in the related art, and the titanium dioxide may be commercially available products as a white pigment, and the like, or may be directly synthesized by well known methods in the related art. For example, the titanium dioxide having a crystal structure such as a rutile structure, a brookite structure, an anatase structure, or the like is known.

In addition, the titanium dioxide may be contained in an amount of about 0.1 to 15 wt %, or about 0.5 to 10 wt %, or about 1 to 7 wt % based on the weight of the polymer resin substrate. Accordingly, as compared to the case of not using separate additives, the first region having a predetermined surface roughness may be formed even under the radiation condition of a relatively low power electromagnetic wave.

In addition, it is preferred that the titanium dioxide has a particle state having a particle diameter of about 100 nm to 5 μm, or about 0.5 to 3 μm, so as to more improve degree of stability of the radiation of the electromagnetic wave in the polymer resin substrate, and to more effectively heat transfer to a depth direction when the electromagnetic wave is radiated.

Meanwhile, additives which are generally used to form the polymer resin products, for example, an UV stabilizer, a heat stabilizer, an impact reinforcing agent, and the like, may be further added or included in the polymer resin substrate as needed, in addition to the above-described titanium dioxide. The additives may be contained in an appropriate amount of about 2 wt % or less, or about 0.05 to 2.0 wt %, based on the weight of the total polymer resin substrate. Meanwhile, the polymer resin substrate does not have to include the specific inorganic additives such as $CuCr_2O_4$ having a spinel structure, and the like, used to form the conductive patterns by radiating the electromagnetic wave which are known in the art.

In addition, the first region has a predetermined surface roughness by radiating laser on the above-described polymer resin substrate, wherein in the first region having the surface roughness, relatively standardized patterns such as hole, mesh pattern, and the like, or concavo-convex shapes may be formed, or amorphous surface structure in which a plurality of irregular holes, patterns, or concavo-convex are complexly formed may be formed, and the polymer resin substrate of the first region may have a predetermined surface roughness due to the various surface shapes or structures. Meanwhile, in order to secure excellent adhesion between the metal layer (conductive patterns) to be formed on the first region and the surface of the polymer resin substrate, the polymer resin substrate of the first region may have a predetermined level or more of surface roughness by radiating an electromagnetic wave such as laser, or the like.

As an example, the first region of the polymer resin substrate may have surface roughness defined by a center line arithmetic average roughness of the absolute values (Ra) of about 500 nm or more, or about 1 µm or more, or about 1 to 5 µm, or about 1 to 3 µm, and the second region which is not radiated by the electromagnetic wave may have surface roughness defined by a central line surface roughness (Ra) smaller than that of the first region, for example, about 400 nm or less, or about 300 nm or less, or about 200 nm or less, or about 0 to 200 nm, or about 50 to 200 nm.

In addition, in another example, the surface roughness of the first and second regions may also be defined by degree of adhesion to the metal layer measured in a cross-cut test according to ISO 2409 standard method. For example, when a cross-cut test having an interval of 2 mm or less according to ISO 2409 standard method is conducted by using a tape having adhesion of about 4.0 to 6.0N/10 mm width, the first region of the polymer resin substrate may have surface roughness defined by adhesion (for example, ISO class 0 or 1) at which a delamination area of a target metal layer under test corresponds to about 5% or less of an area of the metal layer, and when a cross-cut test having an interval of 2 mm or less according to ISO 2409 standard method is conducted by using a tape having adhesion of about 4.0 to 6.0N/10 mm width, the second region of the polymer resin substrate may have surface roughness defined by adhesion (for example, ISO class 5 or more) at which a delamination area of a target metal layer under test corresponds to about 65% or more of an area of the metal layer.

As the polymer resin substrate of the first region has the above-described surface roughness by radiating the electromagnetic wave such as laser, or the like, when the metal layer is formed on the first region in the following plating process, the metal layer may be formed and maintained on the polymer resin substrate with excellent adhesion, to form excellent conductive patterns. As compared to the first region, as the polymer resin substrate of the second region which is not radiated by an electromagnetic wave such as laser, or the like, has the above-described surface roughness due to surface property of the substrate, when the metal layer is formed in the following plating process, the metal layer may be easily removed due to significantly low adhesion from the second region. As a result, the metal layer of the second region may be easily and selectively removed to form the conductive patterns on the polymer resin substrate of the first region.

Meanwhile, an electromagnetic wave such as laser, or the like, may be radiated under predetermined conditions as described below so that the polymer resin substrate of the first region has the above-described surface roughness.

First, in the radiating of the electromagnetic wave, laser electromagnetic wave may be radiated, for example, laser electromagnetic wave having a wavelength of about 248 nm, about 308 nm, about 355 nm, about 532 nm, about 585 nm, about 755 nm, about 1064 nm, about 1070 nm, about 1550 nm, about 2940 nm or about 10600 nm may be radiated. In another example, laser electromagnetic wave having a wavelength in infrared ray (IR) region may be radiated.

In addition, specific conditions at the time of radiating laser electromagnetic wave may be controlled or changed depending on kinds of the resin, physical properties, thickness, of the polymer resin substrate, kinds or thickness of the metal layer to be formed, or appropriate level of adhesion in consideration of the above-mentioned factors. Meanwhile, the laser electromagnetic wave may be radiated under condition that an average power is about 2 W or more, or about 2 to 40 W, or about 3 to 20 W, so that the polymer resin substrate of the first region has a predetermined surface roughness as described above.

As described above, since the titanium dioxide, and the like, are contained in the polymer resin substrate, the first region having appropriate surface roughness may be formed even under a relatively low power condition as compared to the case of not using separate additives, and the metal layer to be formed later may have excellent adhesion to the polymer resin substrate of the first region.

In addition, the laser electromagnetic wave may be radiated once by a relatively high power, but the laser electromagnetic wave may also be radiated two or more times by a relatively low power. As the number of radiating laser electromagnetic wave is increased, the surface roughness is increased, structures such as concavo-convex, and the like, formed on the surface may be changed from hole shaped patterns to mesh pattern, amorphous surface structures, or the like. Therefore, by controlling the condition and the number of radiating laser electromagnetic wave, appropriate surface structure may be formed on the polymer resin substrate of the first region, and the surface roughness having an appropriate degree and excellent adhesion with the metal layer may be provided.

In addition, at the time of radiating laser electromagnetic wave, radiation trace of the electromagnetic wave may be formed in a hole shape, or the like on the polymer resin substrate depending on an radiation interval. However, in order that the polymer resin substrate of the first region has the above-mentioned appropriate surface roughness, it is preferred that the laser electromagnetic wave be radiated so that an interval between central parts of radiation trace of the electromagnetic wave, or an radiation interval of the electromagnetic wave is about 20 µm or more, or about 20 to 70 µm, but is not particularly limited thereto. As a result, the polymer resin substrate of the first region may have appropriate surface roughness and appropriate adhesion with the metal layer, and deterioration of physical properties or the like of the polymer resin substrate may be decreased.

Meanwhile, as described above, after radiating the electromagnetic wave such as laser, or the like, on the first region, a conductive seed may be formed on the polymer resin substrate as shown in FIG. 1. The conductive seed is grown on the polymer resin substrate at the time of plating, and promotes formation of the metal layer by the plating. Accordingly, more excellent metal layer and the conductive patterns may be appropriately formed on the polymer resin substrate of the first region.

The conductive seed may contain metal nanoparticles, metal ions, or metal complex ions. In addition, the metal ion or the metal complex ion may be used as ion itself or as metal-containing compounds to which the metal ions are coupled or as metal complexes containing metal complex ions, or even as particles of the metal-containing compounds or the metal complexes.

The kind of the metal atoms which may be included in the conductive seed is not particularly limited as long as the metal atom has conductivity. For example, the conductive seed may contain at least one kind metal selected from the group consisting of copper (Cu), platinum (Pt), palladium (Pd), silver (Ag), gold (Au), nickel (Ni), tungsten (W), titanium (Ti), chromium (Cr), aluminum (Al), zinc (Zn), tin (Sn), lead (Pb), magnesium (Mg), manganese (Mn) and iron (Fe), ions or complex ions thereof.

In addition, in order to form the conductive seed on the polymer resin substrate, a dispersion liquid or solution containing the above-mentioned conductive seed such as the metal nanoparticles, the metal ions, or the metal complex ions may be applied on the polymer resin substrate, followed by a precipitating method, a drying method, and/or a reducing method, to thereby form the conductive seed in a desirable form, for example, a particle form. More specifically, when the dispersion liquid, or the like, contains the metal nanoparticles, the metal nanoparticles are precipitated by difference in solubility and dried to appropriately form the conductive seed in a particle form, and when the dispersion liquid, or the like, contains the metal ions, or the metal complex ions (or the metal compounds or the complexes containing these ions), the metal ions, or the metal complex ions are reduced and dried to appropriately form the conductive seed in a particle form.

Here, the reducing of the metal ion or the metal complex ion may be performed by using general reducing agents, for example, at least one kind reducing agent selected from the group consisting of an alcohol-based reducing agent, an aldehyde-based reducing agent, hypophosphite-based reducing agent such as hypophosphorous acid sodium or hydrates thereof, or the like, hydrazine-based reducing agent such as hydrazine or hydrates thereof, or the like, sodium borohydride and lithium aluminum hydride.

In addition, the dispersion liquid or the solution may appropriately include an aqueous-based polymer solution capable of improving close adhesion between the polymer resin substrate and the conductive seed, or an aqueous-based complexing agent capable of stabilizing the metal ions or the metal complex ions, as a liquid-phase medium.

Further, the dispersion liquid or the solution of the conductive seed may be applied by general processes for applying a liquid-phase composition to the polymer resin substrate, for example, methods such as dipping, spin coating, spraying, or the like.

The conductive seed formed as described above may be formed on the entire surface of the polymer resin substrate including space between the surface concavo-convex, patterns, or surface structures formed on the first region, and may serve to promote favorable formation of the metal layer in the plating process and to control plating rate, physical properties of the metal layer or the like.

Meanwhile, right after the radiating of the electromagnetic wave as described above, the process of forming the conductive seed may be immediately performed; however, after the polymer resin substrate is selectively surface-treated with a surfactant having surface tension lower than that of the dispersion liquid or solution, the process of forming the conductive seed may be performed. In addition, the polymer resin substrate may be surface-treated in a state in which the surfactant is added to the dispersion liquid or the solution itself for forming the conductive seed.

The surfactant may allow the conductive seed to be more uniformly formed and maintained on the surface of the polymer resin substrate, in particular, between the surface concavo-convex, patterns, or surface structures. The reason is because the surfactant removes air between the surface structures to assist the conductive seed in being easily permeated between the surface structures. Therefore, when the treatment with the surfactant is added, the conductive seed is favorably adsorbed entirely onto the first region, and the metal layer may be more uniformly and favorably formed by the plating process. In addition, due to the treatment with the surfactant and the formation of the conductive seed, adhesion between the metal layer and the polymer resin substrate on the first region may be more improved to favorably form the conductive patterns having excellent conductivity.

Kinds of the surfactant may differ depending on kinds of the dispersion liquid or the solution of the conductive seed as described above, and may include any liquid phase medium having surface tension lower than that of the dispersion liquid or the solution. For example, organic solvents such as ethanol, and the like, having relatively low surface tension may be used as the surfactant.

In addition, the surfactant may be treated by a method of immersing the polymer resin substrate for several seconds to several minutes, and the like.

Meanwhile, referring to FIG. 1, after the conductive seed is formed on the polymer resin substrate, the metal layer may be formed by plating the polymer resin substrate having the conductive seed formed thereon. The process of forming the metal layer may be performed by electroless-plating the conductive metal on the polymer resin substrate, and methods and conditions of performing the electroless-plating process may be conducted by general methods and conditions.

For example, the plating process is performed by using a plating solution containing conductive metals forming the metal layer, for example, metal sources such as copper, and the like, complexing agents, pH adjustors, reducing agent, and the like, to form the metal layer on the polymer resin substrate including the first region and the second region. Here, the metal layer may be formed on the grown conductive seed as described above.

The metal layer may be favorably formed on the first region by excellent adhesion; meanwhile, the metal layer may be easily removed from the second region due to poor adhesion to the polymer resin substrate.

After the metal layer is formed, the conductive seed and the metal layer may be selectively removed from the second region of the polymer resin substrate to form the conductive patterns on the remaining first region.

As described above, since the metal layer is formed on the second region in a state in which it is significantly easy to remove the metal layer, the metal layer and the conductive seed may be selectively removed from the second region by simple methods such as applying weak physical power onto the polymer resin substrate, and the like. Here, due to excellent adhesion between the metal layer and the polymer resin substrate on the first region, the metal layer may remain to form the conductive patterns.

As described above, the process of removing the conductive seed and the metal layer from the second region, may be performed by any method of applying weak physical power onto the polymer resin substrate such as ultrasonic radiation (sonication), liquid phase washing, liquid phase rinsing, air blowing, taping, brushing, or methods of using a manpower such as directly dusting or wiping with hands, or by a combination of two or more methods selected therefrom.

For example, washing or rinsing is performed in deionized water under the ultrasonic radiation for a predetermined time, and air blowing, and the like, are performed, such that the conductive seed and the metal layer of the second region may be selectively removed.

The resin structure having the conductive pattern formed by the above-described method may include the polymer resin substrate divided into the first region formed to have surface roughness defined by a center line arithmetic average roughness of the absolute values (Ra) of about 500 nm or more and the second region having surface roughness smaller than that of the first region, and containing titanium dioxide (TiO$_2$); and the conductive seed and the metal layer selectively formed on the first region of the polymer resin substrate.

Here, since the surface roughness of the first and second regions is sufficiently described in the method according to an exemplary embodiment, additional description thereof will be omitted. In addition, as described above, the first region may correspond to a region in which the electromagnetic wave such as laser, or the like, is radiated.

In this resin structure, even after radiating the electromagnetic wave such as laser, or the like, the titanium dioxide only serves to improve degree of stability of the electromagnetic wave radiation, but is not destroyed by the electromagnetic wave radiation or does not form metal nucleus, and the like, derived from the radiation, which is different from the specific inorganic additives such as CuCr$_2$O$_4$ having a spinel structure, and the like, used in the related art.

As a result, in the structure, the polymer resin substrate of the first and second regions (or the first regions before and after radiating laser) may show substantially same XRD patterns. Here, the substantially same XRD pattern means that when deducing the XRD patterns of the first and second regions (or the first regions before and after radiating laser) under the same conditions and comparing to each other, the number of specific peaks and 2θ to be shown are substantially the same as each other, and therefore, 2θ values of all peaks are the same within the range of about ±0.1°, and relative intensity of all corresponding peaks also has only about 5% or less of difference.

Meanwhile, when using the specific inorganic additives such as CuCr$_2$O$_4$, and the like, as described above, the inorganic additive is destroyed in the region in which the electromagnetic wave such as laser, or the like, is radiated to generate metal nucleus, such that one or more peaks may be additionally shown, or relative intensity of one or more peaks may have about 5% or more of difference.

In addition, in the resin structure according to another exemplary embodiment, the polymer resin substrate of the first and second regions (or the first region before and after radiating laser) may show the XRD pattern including peaks derived from titanium dioxide, and the polymer resin substrate of the second region may show the XRD pattern not including peaks derived from the specific inorganic additives, for example, conductive transition metal such as copper or silver, or metal compounds containing the conductive transition metal. One example of the XRD pattern is shown in FIG. 7. In addition, on the polymer resin substrate of the first region, the metal nucleus, or the like, is not formed from titanium dioxide, even after radiating the electromagnetic wave such as laser, or the like, and the peaks derived therefrom are not shown.

Meanwhile, the resin structure as described above may be various kinds of resin products or resin layers such as a smart phone case, and the like, having conductive patterns for antenna, or may be various kinds of resin products or resin layers having conductive patterns such as other RFID tags, various kinds of sensors, or MEMS structures, and the like.

As described above, according to exemplary embodiments of the present invention, even though high priced and specific inorganic additives such as CuCr$_2$O$_4$ having a spinel structure, and the like, are not contained in the polymer resin substrate itself, surface roughness and adhesion to a metal layer, of a region in which conductive patterns are formed by radiating an electromagnetic wave such as laser, or the like, may be adjusted, such that excellent conductive patterns may be formed on the polymer resin substrate by a simplified process under radiation condition of the electromagnetic wave having relatively low power.

Therefore, the manufacturing cost of the process of forming the conductive patterns may be decreased, and deterioration of physical properties such as mechanical properties, dielectric constant, and the like, of the polymer resin substrate or products caused by the specific inorganic additive, may be minimized.

Further, the titanium dioxide is component widely known as a white pigment in the related art, and the specific inorganic additive is not required to be used as described above, and therefore, according to other exemplary embodiments of the present invention, it is easy to obtain polymer resin products having colors desirable to consumers, such as white color or other various colors.

Hereinafter, action and effects of the present invention are described by specific examples of the present invention in detail. Meanwhile, these examples are provided by way of example, and therefore, should not be construed as limiting the scope of the present invention.

Example 1: Formation of Conductive Patterns by Laser Direct Radiation

A polycarbonate resin substrate containing an UV stabilizer, a thermal stabilizer, and an impact reinforcing agent having a total amount of less than 2 wt %, and containing 5 wt % of titanium dioxide (TiO$_2$) was prepared. Here, it could be confirmed that the polycarbonate resin substrate to which titanium dioxide was not added had brightness L* value of 80 to 82; meanwhile, the resin substrate to which titanium dioxide was added had brightness L* value of 95 to 97, which has significantly bright white color, wherein the brightness L* value was measured based on CIE L*a*b* tintometer using colorimeter.

Laser having a wavelength of 1064 nm was radiated once onto a predetermined region of the polycarbonate resin substrate under radiation condition (average power: 16 W) having an power ratio of 60%. Here, the interval between central parts of the laser radiation trace of the polycarbonate resin substrate was controlled to be about 35 μm by controlling the radiation interval of the laser.

Accordingly, the polycarbonate resin substrate radiated by laser had a predetermined surface roughness on the predetermined region. The center line arithmetic average roughness of the absolute values (Ra) of the region radiated by laser and the region which is not radiated by laser were measured. These Ra were measured in an area of 0.2 mm×0.3 mm by using an optical profiler (Nano view E1000, Nanosystem, Korea). As a result of the measurement, the region radiated by laser had Ra of about 1820 nm and the region which is not radiated by laser had Ra of about 138 nm, respectively. A photograph of the polycarbonate resin substrate as manufactured above was shown in FIG. 2a, and an optical microscope photograph of the region radiated by laser formed so as to have surface roughness was shown in FIG. 2b.

Then, a process of immersing the polycarbonate resin substrate into a mixed solution in which an aqueous-based polymer solution including Pd-containing compound particles is mixed with ethanol for about 5 minutes, and drying the substrate was repeated several times, to form conductive seed particles including Pd on the substrate. Next, the substrate was washed with deionized water, and an electroless-plating was performed by using copper as a conductive metal. At the time of the electroless-plating, a plating solution containing copper source (copper sulfate), a complexing agent (Rochelle salt), a pH adjustor (sodium hydroxide aqueous solution), and a reducing agent (formaldehyde), was used. The electroless-plating was performed at room temperature for about 1 hour, followed by ultrasonic cleaning, to form the metal layer.

Photographs showing the metal layers formed as described above were shown in FIGS. 3a and 3b. Referring to FIG. 3b, it could be confirmed that the metal layer was favorably formed on the region radiated by laser; however, the metal layer in the remaining region was formed in a delamination state due to poor adhesion to be significantly easily removed.

Then, the substrate was immersed into the deionized water, followed by ultrasonic radiation (sonication) for 15 minutes, and air blowing, to selectively remove the metal layer of the region which is not radiated by laser. Accordingly, the conductive patterns having the metal layer were selectively formed on the region radiated by laser, and a photograph thereof was shown in FIG. 4a, and an optical microscope photograph of the metal layer formed on the region radiated by laser through electroless plating was shown in FIG. 4b.

Meanwhile, a cross-cut test according to ISO 2409 standard method was conducted by using a tape having about 4.9N/10 mm width (3M scotch tape #371) in the region radiated by laser, that is, the region having the metal layer and the conductive patterns formed thereon. Here, adhesion between the substrate and the metal layer was tested by cutting the metal layer to be 10×10 graph (an interval of about 2 mm or less), and measuring area of the metal layer delaminated by attaching and detaching the tape. Photograph showing the result of the adhesion test was shown in FIG. 5.

As a result of the adhesion test, it could be confirmed that the delamination area of the target metal layer under test corresponds to about 5% or less (ISO class 1) of the area of the metal layer, and the metal layer and the conductive patterns were favorably formed on the region radiated by laser by excellent adhesion.

Example 2: Formation of Conductive Patterns by Laser Direct Radiation

Conductive patterns of Example 2 were formed by the same method as Example 1 except that the radiation condition of the laser was changed into the radiation condition (average power: 20 W) having an power ratio of 75%.

In Example 2, after radiating laser, the center line arithmetic average roughness of the absolute values (Ra) of the region radiated by laser and the region which is not radiated by laser were measured by the same method as Example 1, and the region radiated by laser had Ra of about 3820 nm and the region which is not radiated by laser had Ra of about 152 nm, respectively.

In addition, after the metal layer and the conductive patterns were formed in Example 2, a cross-cut test was conducted by the same method as Example 1 in the region having the metal layer and the conductive patterns formed thereon. As a result of the adhesion test, it could be confirmed that the delamination area of the target metal layer under test corresponds to about 0% (ISO class 0) of the area of the metal layer, and the metal layer and the conductive patterns were favorably formed on the region radiated by laser by excellent adhesion.

Comparative Example 1: Formation of Conductive Patterns by Laser Direct Radiation Conductive patterns of Comparative Example 1 were formed by the same method as Example 1 except that the process of forming the conductive seed particles including Pd in Example 1 was not performed, but an electroless-plating was performed for 3 hours instead of 1 hour.

It was confirmed in Comparative Example 1 that the electroless-plating was not completely performed even in the region radiated by laser, such that the metal layer and the conductive patterns were not completely formed. An optical microscope photograph of the metal layer formed on the region radiated by laser through the electroless-plating according to Comparative Example 1 was shown in FIG. 6.

It could be appreciated from FIG. 6 that the conductive seed particles were not formed, such that the plating was performed only in a portion of the region radiated by laser. For reference, only shining portions among the entirely dark portion in FIG. 6 are portions in which the plating was completely performed. That is, it was confirmed in Comparative Example 1 that the electroless-plating was not completely performed even in the region radiated by laser, such that the metal layer and the conductive patterns were not completely formed.

Comparative Example 2: Formation of Conductive Patterns by Laser Direct Radiation Conductive patterns of Comparative Example 2 were formed by the same method as Example 1 except that the titanium dioxide was not used and the radiation condition of the laser was changed into the radiation condition (average power: 18 W) having an power ratio of 70%.

In Comparative Example 2, after radiating laser, the center line arithmetic average roughness of the absolute values (Ra) of the region radiated by laser and the region which is not radiated by laser were measured by the same method as Example 1, and the region radiated by laser had Ra of about 830 nm and the region which is not radiated by laser had Ra of about 223 nm, respectively.

In addition, after the metal layer and the conductive patterns were formed in Comparative Example 2, a cross-cut test was conducted by the same method as Example 1 in the region having the metal layer and the conductive patterns formed thereon. As a result of the adhesion test, it could be confirmed that the delamination area of the target metal layer under test corresponds to more than about 5% to 15% or less (ISO class 2) of the area of the metal layer, and therefore, the metal layer and the conductive patterns were formed on the region radiated by laser; however, the conductive patterns were not favorably maintained by relatively poor adhesion to the substrate.

Reference Example 1: Formation of Conductive Patterns by Laser Direct Radiation (Using Specific Inorganic Additive)

A polycarbonate resin substrate containing an UV stabilizer, a thermal stabilizer, and an impact reinforcing agent having a total amount of less than 2 wt %, and containing 3 wt % of inorganic additive ($Cu_2(OH)PO_4$) (ivory color) was prepared. Here, it could be confirmed that the polycarbonate resin substrate to which titanium dioxide was not added had brightness L* value of 80 to 82; meanwhile, the resin substrate to which the inorganic additive was added had brightness L* value of 89 to 91, which had dark color as compared to Example 1, wherein the brightness L* value was measured based on CIE L*a*b* tintometer using colorimeter, and thus, additional white pigment, and the like, are required in implementing final white color.

Laser having a wavelength of 1064 nm was radiated once onto a predetermined region of the polycarbonate resin substrate under radiation condition (average power: 6.6 W) having an power ratio of 25%. Here, the interval between central parts of the laser radiation trace of the polycarbonate resin substrate was controlled to be about 35 μm by controlling the radiation interval of the laser.

Accordingly, the polycarbonate resin substrate radiated by laser had a predetermined surface roughness on the predetermined region. The center line arithmetic average roughness of the absolute values (Ra) of the region radiated by laser and the region which is not radiated by laser were measured by the same method as Example 1, and as a result of the measurement, the region radiated by laser had Ra of about 5270 nm and the region which is not radiated by laser had Ra of about 182 nm, respectively.

Then, the electroless-plating was performed by using copper as the conductive metal. At the time of the electroless-plating, a plating solution containing copper source (copper sulfate), a complexing agent (Rochelle salt), a pH adjustor (sodium hydroxide aqueous solution), and a reducing agent (formaldehyde), was used. The electroless-plating was performed at room temperature for about 3 hours, followed by ultrasonic cleaning, to form the metal layer.

Then, the substrate was immersed into the deionized water, followed by ultrasonic radiation (sonication) for 15 minutes, and air blowing, to selectively remove the metal layer of the region which is not radiated by laser. Accordingly, the conductive patterns having the metal layer were selectively formed on the region radiated by laser.

In addition, after the metal layer and the conductive patterns were formed in Reference Example 1, a cross-cut test was conducted by the same method as Example 1 in the region having the metal layer and the conductive patterns formed thereon. As a result of the adhesion test, it could be confirmed that the delamination area of the target metal layer under test corresponds to more than about 5% to 15% or less (ISO class 2) of the area of the metal layer, and therefore, the metal layer and the conductive patterns were formed on the region radiated by laser; however, the conductive patterns were not favorably maintained by relatively poor adhesion to the substrate.

It could be confirmed from test results of Examples, Comparative Examples, and Reference Example as described above that according to Examples, excellent conductive patterns were formed on the region radiated by laser without using the specific inorganic additive even under the radiation condition of the laser having lower power than that of Comparative Example 2, and the like, in which the additive was not used.

It could be confirmed from Comparative Examples that since titanium dioxide is not used or the process of forming the conductive seed particles is not performed, excellent conductive patterns could not be formed even under the radiation condition of the laser having relatively high power.

In addition, it could be confirmed from Reference Example 1 that even though the specific inorganic additive was used, excellent conductive patterns could not be formed under the radiation condition of the laser having significantly low power.

Further, it could be confirmed that as compared to Reference Example 1 using the specific inorganic additive, the resin substrates of Examples using titanium dioxide had significantly bright white color, such that it is easy to implement resin products having colors desirable to consumers, for example, white color or other various colors.

Test Example: Comparison in XRD Pattern Between Region Radiated by Laser and Region not Radiated by Laser XRD patterns of the substrates after radiating laser according to Example 1 and Comparative Example 2 were analyzed and shown in FIG. 7. Referring to FIG. 7, it could be confirmed that in the XRD pattern of Example 1, peaks derived from titanium dioxide were shown (see red line of FIG. 7), and peaks derived from the specific inorganic additives, for example, the conductive transition metal such as copper or silver or metal compounds containing the conductive transition metal, were not shown.

Meanwhile, it could be confirmed that in the XRD pattern of Comparative Example 2, peaks derived from titanium dioxide were not shown.

The invention claimed is:

1. A method for forming conductive pattern by direct radiation using an electromagnetic wave, the method comprising:
    preparing a polycarbonate polymer resin substrate containing titanium dioxide ($TiO_2$) having a rutile crystal structure and in a particle state having a particle diameter of 100 nm to 5 μm, and in an amount of 1 to 7 wt % based on the weight of the polycarbonate resin substrate, wherein the $TiO_2$ effects heat transfer to a depth direction of the polycarbonate polymer resin substrate when the polycarbonate polymer resin substrate is irradiated by a laser electromagnetic wave;
    forming a first region having a predetermined surface roughness by selectively irradiating the polycarbonate polymer resin substrate with a laser electromagnetic wave having a wavelength of 1064 nm and an average power of about 3 to 20 W, the polycarbonate polymer resin having a second region that is not irradiated by the laser electromagnetic wave;
    forming a conductive seed on the polymer resin substrate by applying a dispersion liquid comprising ethanol and metal nanoparticles on the polycarbonate polymer resin substrate and precipitating and drying the metal nanoparticles to form the conductive seed in a particle form;
    forming a metal layer by plating the polymer resin substrate having the conductive seed formed thereon; and
    removing the conductive seed and the metal layer from the second region of the polycarbonate polymer resin substrate by sonication followed by air blowing,
    wherein the first region of the polycarbonate polymer resin substrate has surface roughness defined by a center line arithmetic average roughness of the absolute values (Ra) of 1 μm to 5 μm, and the second region has a center line arithmetic average roughness of the absolute values (Ra) smaller than that of the first region.

2. The method of claim 1, wherein the surface roughness of the first region of the polycarbonate resin substrate as defined by degree of adhesion to the metal layer measured using an ISO 2409 standard method cross-cut test having an interval of 2 mm or less using a tape having adhesion of 4.0 to 6.0 N/10 mm width is a delamination area of 5% or less.

3. The method of claim 1, wherein the surface roughness of the second region of the polycarbonate resin substrate as defined by degree of adhesion to the metal layer measured using an ISO 2409 standard method cross-cut test having an interval of 2 mm or less using a tape having adhesion of 4.0 to 6.0 N/10 mm width is a delamination area of 65% or more.

4. The method of claim 1, wherein the conductive seed contains at least one kind metal selected from the group consisting of copper (Cu), platinum (Pt), palladium (Pd), silver (Ag), gold (Au), nickel (Ni), tungsten (W), titanium (Ti), chromium (Cr), aluminum (Al), zinc (Zn), tin (Sn), lead (Pb), magnesium (Mg), manganese (Mn) and iron (Fe), ions or complex ions thereof.

5. The method of claim 1, further comprising surface-treating the polymer resin substrate with a surfactant having surface tension lower than that of the dispersion liquid or solution, between the radiating of the electromagnetic wave and the forming of the conductive seed.

6. The method of claim 1, wherein the forming of the metal layer includes electroless-plating a conductive metal on the polymer resin substrate.

* * * * *